US009640946B2

(12) United States Patent
Sgandurra et al.

(10) Patent No.: US 9,640,946 B2
(45) Date of Patent: May 2, 2017

(54) ELECTRONIC FAIL-SAFE LASER SHUTTER

(71) Applicant: Prima Electro North America, LLC, Chicopee, MA (US)

(72) Inventors: Francesco Sgandurra, Rivalta di Torino (IT); Luca DiStefano, Turin (IT)

(73) Assignee: PRIMA ELECTRO NORTH AMERICA, Chicopee, MA (US)

( * ) Notice: Subject to any disclaimer, the term of this patent is extended or adjusted under 35 U.S.C. 154(b) by 0 days.

(21) Appl. No.: 13/911,225

(22) Filed: Jun. 6, 2013

(65) Prior Publication Data

US 2014/0362882 A1    Dec. 11, 2014

(51) Int. Cl.
*H01S 3/13*        (2006.01)
*H01S 5/068*      (2006.01)
*H02M 3/335*    (2006.01)
*H02M 1/10*      (2006.01)
*H02M 1/42*      (2007.01)
*H02M 3/337*    (2006.01)
*H01S 5/042*      (2006.01)

(52) U.S. Cl.
CPC .......... H01S 5/06825 (2013.01); *H01S 5/042* (2013.01); *H02M 1/10* (2013.01); *H02M 1/4208* (2013.01); *H02M 3/3376* (2013.01); *H02M 3/33523* (2013.01)

(58) Field of Classification Search
CPC ........ H01S 3/225; H01S 3/036; H01S 3/0385; H01S 3/038; H01S 3/0381; H01S 3/0387; H01S 3/223; H01S 3/041; H01S 3/22; H01S 3/2207; H01S 3/0382; H01S 3/09702; H01S 3/0388; H01S 3/097; H01S 3/2383

USPC ...................................................... 372/29.012
See application file for complete search history.

(56) References Cited

U.S. PATENT DOCUMENTS

| | | | | |
|---|---|---|---|---|
| 5,012,058 A | * | 4/1991 | Smith ................ | H02M 3/3376 219/716 |
| 5,019,952 A | * | 5/1991 | Smolenski .......... | H02M 1/4208 323/222 |
| 5,483,436 A | * | 1/1996 | Brown ...................... | B60L 9/22 323/222 |
| 5,729,121 A | * | 3/1998 | Coenders et al. ............ | 323/361 |

(Continued)

FOREIGN PATENT DOCUMENTS

WO    WO 2009/026600    *    3/2009    .............. G06F 1/26

*Primary Examiner* — Xinning Niu
*Assistant Examiner* — Vu A Vu
(74) *Attorney, Agent, or Firm* — Barlow, Josephs & Holmes, Ltd.

(57) ABSTRACT

An improved laser safety shutter is provided for the main supply power to the laser diode to be routed through an electronic shutter that prevents the passing of the supply power to the laser diodes to achieve laser shutdown or in the event of a control power failure. The main power is routed through a rectifier to convert the incoming alternating current (AC) feed to direct current (DC) power. A switching array operates in an alternating cycle so as to provide AC power to be transformed and passed along to the laser diode pump on the load side of the transformer. When shut down of the laser is desired or when power to the controller fails, the switches stop operating and the resultant DC power cannot be passed by the transformer effectively cutting the supply power to the laser diodes.

13 Claims, 1 Drawing Sheet

(56) References Cited

U.S. PATENT DOCUMENTS

| | | | | |
|---|---|---|---|---|
| 6,232,728 B1 * | 5/2001 | Yamamoto | ............ | H05B 41/042 |
| | | | | 315/291 |
| 6,597,075 B1 * | 7/2003 | Goodrich, II | .................... | 307/66 |
| 7,706,158 B2 * | 4/2010 | Gordon | ...................... | 363/56.12 |
| 8,218,338 B2 * | 7/2012 | Lin | ......................... | H02M 1/10 |
| | | | | 323/266 |
| 8,482,935 B2 * | 7/2013 | Suntio | ............... | H02M 3/33523 |
| | | | | 323/906 |
| 2008/0291709 A1 * | 11/2008 | Kawasaki | ....................... | 363/77 |
| 2013/0058135 A1 * | 3/2013 | Marino | ............. | H02M 3/33507 |
| | | | | 363/21.02 |

* cited by examiner

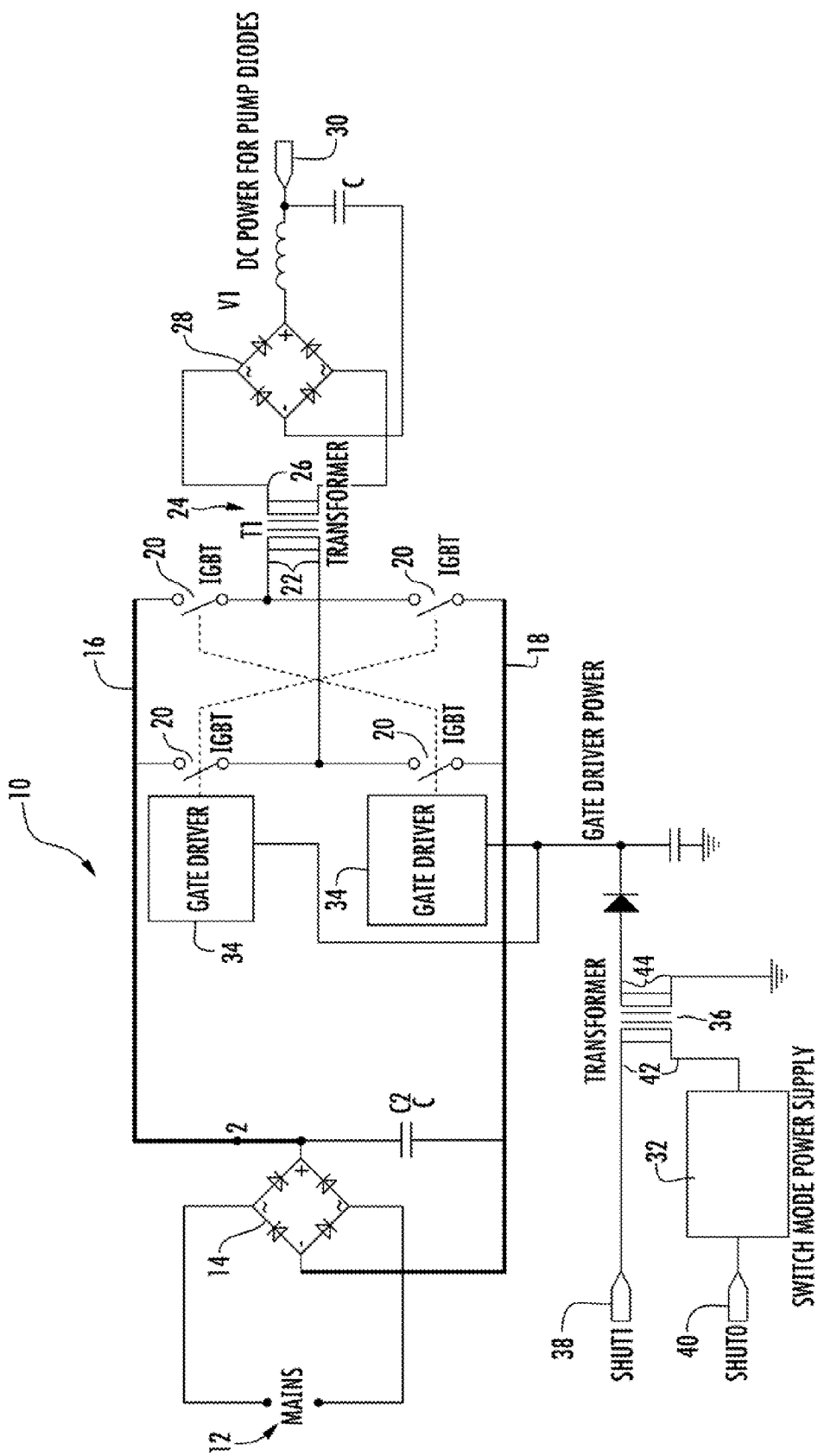

ELECTRONIC FAIL-SAFE LASER SHUTTER

BACKGROUND OF THE INVENTION

The present invention relates generally to a safety system for terminating the emission of a laser emission from a laser radiation source. More specifically, the present invention relates to a fail-safe laser shutter apparatus that electronically operates to terminate the supply power to a laser radiation source in a manner that renders the laser verifiably safe.

Continuous radiation type laser radiation sources have been employed in machine tools, medical machines such as laser scalpels and laser coagulators and length measuring machines. While lasers have become commonplace in these environments, lasers come with an inherent safety hazard. While the potential for burns are one risk related to laser operation, the larger concern is the ability of laser light to blind an unsuspecting individual. Surprisingly low intensity levels of laser radiation can cause permanent vision loss before the human eye can react. For this reason, vision safety should be of paramount importance in a laser environment.

Primarily, protection of vision from laser radiation exposure is accomplished through the use of safety goggles. Goggles with filters for blocking laser light at various wavelengths are available from a multitude of manufacturers. If chosen and worn properly, they provide adequate protection to those working with lasers while still allowing adequate visual perception to perform normal laboratory functions.

While safety goggles provide protection to announced visitors or those individuals who regularly work with lasers, the unexpected guest is still at extreme risk. To provide protection to these individuals, most lasers incorporate an interlock mechanism that shuts the laser down during an unexpected breach of the laser work area. Usually, a switch of some sort is connected to the cabinet doors of the work area that activates the interlock. However, most interlock mechanisms operate by shutting down the laser power supply. Doing this requires that the laser be restarted after each shutdown. This situation is very inconvenient, time consuming and may be damaging to the laser.

As an alternative to the interlock, many systems have instead incorporated a safety shutter. A safety shutter functions by physically blocking the laser beam when a breach in the laser work area occurs. It has typically been the practice to provide a mechanical shutter that is movable between open and closed positions for interrupting the laser output beam from a laser beam radiation source. In the event of failure of the mechanical shutter, however, the laser beam is emitted at an unexpected time, potentially putting a person at risk if injury. Such shutter systems are more convenient than the interlock mechanism, and they produce no strain on the laser system. The safety shutter can be controlled the same as an interlock and it provides a convenient means of stopping the laser beam when access to the operational system is required.

The difficulty that arises in mechanical shutters however results from the fact that the shutter needs to physically move into the path of the laser. With the all monolithic design of modern diode and fiber laser technology the implementation of a mechanical shutter would require free space optics to create a location for the shutter to physically block the beam. As a result, in many cases substantial loss in beam quality results from the inclusion of the needed free space optics.

There is therefore a need for a failsafe laser shutter mechanism that operates on monolithic laser systems without the need for cutting the main power or introducing free space optics. There is a further need for an electronic shutter that operates in a fail safe manner to reliably render a laser safe without requiring a full shutdown or the laser or substantial decrease in the laser beam quality.

BRIEF SUMMARY OF THE INVENTION

In this regard, the present invention provides for a failsafe electronic shutter for use instead of the mechanical shutter previously known in the art. The present disclosure provides a method and system for achieving a fail-safe power shut off that insures that no power is delivered to the laser diodes thereby eliminating all potential hazards for eye and other injuries from the laser beam when entering or accessing the laser system.

The improved laser safety shutter of the present invention employs an arrangement whereby the main supply power to the laser diode is routed through an electronic shutter circuit that prevents the passing of the supply power to the laser diodes when the control circuitry calls for a laser shutdown or in the event of a control power failure thereby insuring that the system is fail safe. Generally, the main power is routed through a rectifier to convert the incoming alternating current (AC) feed to direct current (DC) power. The power output is then routed through a switching array comprised of solid state insulated-gate bipolar transistors (IGBT). When the controller is in operation the switches operate in an alternating cycle so as to provide AC power to the supply side of an isolation transformer which in turn allows the AC power to be transformed and passed along to the laser diode pump on the load side of the transformer. However, when shut down of the laser is desired or when power to the controller fails, the IGBT switches stop operating. The resultant DC power cannot be passed by the transformer thereby effectively cutting the supply power to the load side of the transformer and ultimately the laser diodes.

It is an object of the present invention to provide a method and system for achieving a fail-safe power shut off that insures that no power is delivered to the laser diodes thereby eliminating all potential hazards for eye and other injuries from the laser beam when entering or accessing the laser system.

In one embodiment, an electronic shutter module is provided in the supply voltage side of a laser diode, pump diode or laser array to disrupt the power thereto when indicated by a controller.

In another embodiment, an electronic shutter module is provided in the supply voltage side of a laser diode, pump diode or laser array to disrupt the power thereto in a manner that allows the system to resume normal operation without the need for recycling or resetting the system.

In a further embodiment, a control system for a high powered laser is provided that includes an electronic shutter module in the supply voltage side of a laser diode, pump diode or laser array to disrupt the power thereto when indicated by a controller, in a power failure of as the result of an interlock system.

These together with other objects of the invention, along with various features of novelty which characterize the invention, are pointed out with particularity in the claims annexed hereto and forming a part of this disclosure. For a better understanding of the invention, its operating advantages and the specific objects attained by its uses, reference should be had to the accompanying drawings and descriptive matter in which there is illustrated a preferred embodiment of the invention.

BRIEF DESCRIPTION OF THE DRAWINGS

In the drawings which illustrate the best mode presently contemplated for carrying out the present invention:

The FIGURE is a schematic illustration of an embodiment of the electronic shutter laser controller of the present invention.

DETAILED DESCRIPTION OF THE INVENTION

Now referring to the drawing, a method and system is disclosed for achieving a fail-safe power shut off that insures that no power is delivered to the laser diodes thereby eliminating all potential hazards for eye and other injuries from the laser beam when entering or accessing the laser system.

Generally, the improved laser safety shutter of the present invention employs an arrangement whereby the main supply power to the laser diode is routed through an electronic shutter circuit that prevents the passing of the supply power to the laser diodes when the control circuitry calls for a laser shutdown or in the event of a control power failure, thereby insuring that the system is fail safe. As will be discussed in more detail below, the main power is routed through a rectifier to convert the incoming alternating current (AC) to direct current (DC) power. Clearly if the main power is already direct current (DC), the power is fed into the system without need for rectifying. The DC power is then routed through a switching array comprised of solid state insulated-gate bipolar transistors (IGBT), MOSFETs or other switches. When the controller is in operation, the switches operate in an alternating cycle so as to provide AC power to the supply side of an isolation transformer. The isolation transformer in turn allows the AC power to be transformed and passed along to the laser diode pump on the load side of the transformer. However, when shut down of the laser is desired, or when power to the controller fails, the switches stop operating. The resultant DC power cannot be passed by the transformer, thereby effectively cutting the supply power to the load side of the transformer and ultimately the laser diodes.

Turning now to the FIGURE, a control arrangement for a laser system is shown and illustrated. The main AC power input 12 enters the electronic shutter circuit 10 as depicted at the left of the FIGURE. The AC power entering the main input 12 is then routed through a first rectifier 14 to convert the AC supply power to DC power. Note if the main power is already DC then this step is unnecessary. The positive 16 and negative 18 DC power supplies are then routed to a switching array preferably comprised of four IGBT switches 20. By operation of the switching array (as described in detail below) the IGBT switches 20 are switched in alternating fashion to convert the DC power back to AC power. The output of the IGBT switches 20 is in turn routed to the supply side 22 of an isolation transformer 24. Finally, the AC power output 26 from the isolation transformer 24 is again rectified by rectifier 28 and fed as a DC supply to the laser source 30. It should also be noted that should the output power be required as AC, then this rectifying step is not necessary.

It is known that isolation transformer 24 cannot pass DC power therethrough. As a result, since the power being fed into the electronic shutter circuit 10 is first converted to DC power by rectifier 14, in a static state wherein the IGBT switches 20 are not in operation the DC power is passed to the supply side 22 of the isolation transformer 24 wherein it cannot be passed along by the transformer 24 and it is galvanically separated from the laser 30. Accordingly, when the IGBT switches 20 are not in operation, the laser is rendered inoperable and safe. When the IGBT switches 20 are pulsed to operate in alternating fashion, the DC power is converted to AC power, which can then be passed through the coils of the isolation transformer 24 and ultimately to the laser 30.

Control of the IGBT switches 20 is accomplished through the switch mode power supply 32 and the gate drivers 34. Another isolation transformer 36 is employed in the switch control circuit, wherein a high signal must exist on both inputs 38 and 40 for an AC power signal to exist at the input side 42 of the isolation transformer 36. Absent AC power on the input side 42 of the isolation transformer 36, no power will be passed to the secondary coil 44. Absent the power, the gate drivers 34 will not operate to drive the IGBT switches 20. When power is present on both inputs 38 and 40, the gate drivers 34 will operate in a pulsed, alternating fashion to alternately drive the IGBT switches 20 and generate AC power to the supply side 22 of the isolation transformer 24 to render the laser device 30 operational. Should a signal be lost or cut on either or both inputs 38 and 40 the gate driver circuit will go dead and the IGBT switches 20 will not operate to supply AC power to the isolation transformer 24 thereby preventing power transfer therethrough and rendering the laser device 30 inoperable.

It is of note that the fail safe electronic shutter circuit 10 of the present invention does not need to mechanically intercept the laser beam with a mechanical shutter thereby allowing the laser and transmission fibers to remain monolithic in construction. Further, the laser shut down is achieved at a point in the circuit that prevents the need for shutting down the entire system. The practical advantage of the present invention is that since the IGBT switches 20 are solid state there are not mechanical relays to be operated that introduce lifecycle issues and that the time to safely switch on and off the laser is low, on the order of 1 ms, making its effect on machine cycle time negligible.

It should be appreciated by one skilled in the art that laser source 30 may be laser diodes, pump diodes for a fiber laser or amplifier arrangement, a laser array or any other known laser source.

It should also be appreciated by one skilled in the art that any number of interlocks, safety features, shut downs or switches may be incorporated into the control circuit. When any of these devices indicate an open condition, the control circuit stops operating the gate drivers which in turn stop the operation of the IGBT switches. As a result, the laser output device is rendered safe.

It can therefore be seen that the present invention provides a method and system for achieving a fail-safe power shut off that insures that no power is delivered to the laser diodes thereby eliminating all potential hazards for eye and other injuries from the laser beam when entering or accessing the laser system. Further, an electronic shutter module is provided in the supply voltage side of a laser diode, pump diode or laser array to disrupt the power thereto in a manner that allows the system to resume normal operation without the need for recycling or resetting the system. For these reasons, the instant invention is believed to represent a significant advancement in the art, which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A fail-safe safety circuit for disabling a laser system including a main power supply and a laser output device, comprising:
   a means for converting the main alternating current power to direct current power;
   an array of switches, said switches converting said direct current power to alternating current power when operated in an alternating pulsed fashion, said switches leaving said direct current power unchanged when not operated in an alternating pulsed fashion;
   an isolation transformer, said isolation transformer passing only said alternating current power to said laser output device, said isolation transformer stopping the transmission of direct current power; and
   a control circuit for controlling said switches, said control circuit further including a control isolation transformer preventing transfer of power to said switches should there be a failure in any portion of the control circuit.

2. The fail-safe safety circuit of claim 1, wherein said means for converting the main power to direct current power is a rectifier.

3. The fail-safe safety circuit of claim 1, further comprising:
   a switch mode controller for controlling operation of said switches.

4. The fail-safe safety circuit of claim 1, further comprising:
   a gate driver to operate said array of switches.

5. The fail-safe safety circuit of claim 4, further comprising:
   a switch mode controller for controlling operation of said gate driver and of said switches.

6. The fail-safe safety circuit of claim 1, wherein said switches are solid state switches.

7. A fail-safe safety circuit for disabling a laser system including a main power supply and a laser output device, comprising:
   a rectifier for converting the main alternating current power to direct current power;
   an array of switches, said switches converting said direct current power to alternating current power when operated in an alternating pulsed fashion, said switches leaving said direct current power unchanged when not operated in an alternating pulsed fashion;
   a controller for controlling the operation of said array of switches said controller further including an isolation transformer preventing transfer of power to said switches should there be a failure in any portion of the control circuit; and
   a control isolation transformer, said isolation transformer passing only said alternating current power to said laser output device, said isolation transformer stopping the transmission of direct current power.

8. A method for disabling a laser system including a main power supply and a laser output device, comprising:
   converting the main alternating current power to direct current power;
   routing said direct current power to an array of switches;
   operating said switches in an alternating pulsed fashion to convert said direct current power to alternating current power output or, said switches leaving said direct current power unchanged when not operated in an alternating pulsed fashion;
   routing said alternating or direct current output from said switches to an isolation transformer, said isolation transformer passing only said alternating current power to said laser output device, said isolation transformer stopping the transmission of direct current power; and
   controlling said switches via a control circuit, said control circuit further including a control isolation transformer preventing transfer of power to said switches should there be a failure in any portion of the control circuit.

9. The method of claim 8, wherein said means for converting the main power to direct current power is a rectifier.

10. The method of claim 8, further comprising:
    a switch mode controller for controlling operation of said switches.

11. The method of claim 8, further comprising:
    a gate driver to operate said array of switches.

12. The method of claim 11, further comprising:
    a switch mode controller for controlling operation of said gate driver and of said switches.

13. The method of claim 8, wherein said switches are solid state switches.

* * * * *